(12) United States Patent
Bannon et al.

(10) Patent No.: US 10,715,175 B2
(45) Date of Patent: Jul. 14, 2020

(54) SYSTEMS AND METHODS FOR ENCODING AND DECODING

(71) Applicant: Tesla, Inc., Palo Alto, CA (US)

(72) Inventors: Peter Joseph Bannon, Woodside, CA (US); Kevin Altair Hurd, Redwood City, CA (US)

(73) Assignee: Tesla, Inc., Palo Alto, CA (US)

(*) Notice: Subject to any disclaimer, the term of this patent is extended or adjusted under 35 U.S.C. 154(b) by 30 days.

(21) Appl. No.: 15/688,808

(22) Filed: Aug. 28, 2017

(65) Prior Publication Data

US 2019/0068217 A1 Feb. 28, 2019

(51) Int. Cl.
*H03M 7/40* (2006.01)
*H04N 19/42* (2014.01)
*H04N 19/436* (2014.01)
*H03M 7/30* (2006.01)

(52) U.S. Cl.
CPC ............... *H03M 7/40* (2013.01); *H03M 7/30* (2013.01); *H03M 7/6005* (2013.01); *H03M 7/607* (2013.01); *H03M 7/6029* (2013.01); *H04N 19/42* (2014.11); *H04N 19/436* (2014.11)

(58) Field of Classification Search
CPC ........ H03M 7/40; H03M 7/30; H04N 19/436; H04N 19/42
See application file for complete search history.

(56) References Cited

U.S. PATENT DOCUMENTS

| | | | |
|---|---|---|---|
| 2007/0096954 A1* | 5/2007 | Boldt | H03M 7/30 341/50 |
| 2012/0158301 A1* | 6/2012 | Schilling | H03M 7/40 701/533 |
| 2013/0010864 A1* | 1/2013 | Teng | H04N 19/176 375/240.12 |
| 2014/0022098 A1* | 1/2014 | Fallon | G06T 9/00 341/87 |
| 2017/0220488 A1* | 8/2017 | Balasubramonian | H03M 7/30 |

* cited by examiner

*Primary Examiner* — Qian Yang
(74) *Attorney, Agent, or Firm* — Knobbe, Martens, Olson & Bear, LLP

(57) ABSTRACT

Various embodiments of the invention provide systems, devices, and methods for decompressing encoded electronic data to increase decompression throughput using any number of decoding engines. In certain embodiments, this is accomplished by identifying and processing a next record in a pipeline operation before having to complete the decompression of a current record. Various embodiments take advantage of the knowledge of the method of how the records have been encoded, e.g., in a single long record, to greatly reduce delay time, compared with existing designs, when decompressing encoded electronic data.

20 Claims, 8 Drawing Sheets

400

450

SYSTEMS AND METHODS FOR ENCODING AND DECODING

A. TECHNICAL FIELD

The present disclosure relates to accelerated decompression of compressed data, and more particularly, to systems and methods for accelerated and efficient decompression of compressed data blocks using an appended identifier that identifies a compression method and length of each compressed data block.

B. DESCRIPTION OF THE RELATED ART

One skilled in the art will recognize that there are numerous methods to compress and decompress electronic data. The efficiency of these compression algorithms varies based on the specific characteristics of data blocks to be compressed and the particular steps of a compression algorithm. An optimal compression algorithm for certain data blocks may not be as efficient for other data blocks based on the specific data within the block, the length of the block and other characteristics known to one of skill in the art. The term "data block" is intended to be broadly construed and includes any type of data that may be compressed or decompressed such as data symbols, fixed-length data blocks, variable-length data blocks, previously encoded data blocks, etc. In time-sensitive systems, the decompression and subsequent processing of data blocks may represent a significant aspect in the timing and throughput of the system.

Most decompression algorithms are sequential in nature, which limits throughput and may render the system sub-optimal for certain high-speed applications including, but not limited to, image processing, autonomous driving, artificial intelligence, analysis of large amounts of data and video processing. In one example, decompressing binary data that has been compressed using Huffman compression requires that bits be parsed one at a time, each bit containing information about the next bit. As a result, the decompression algorithm has to wait to find (e.g., identify a running edge) and decode a next data block until the entire decoding process for the previous data block has been completed.

FIG. 1 illustrates a common sequential decompression scheme within the prior art. System 100 comprises a Huffman decompression engine 104 that performs sequential decompression of data using the Huffman algorithm. In particular, the Huffman decompression engine receives previously Huffman-based compressed blocks 102 of data that are sequentially decompressed by the decompression engine 104 to output decompressed blocks 120.

While used in the prior art, Huffman compression and decompression methods may not be optimal for certain data blocks. In addition, Huffman encoding may not be preferred in certain pipelined processes because of its inability to fully utilize the speed advantage of the pipelined process itself. Huffman encoding dictates that blocks 102, which each contain information about a next block 103, be decompressed and parsed one at a time. The Huffman decompression engine 104 cannot proceed to process block 103 until the entire decoding process for block 102 has been completed. The resulting waiting time causes unnecessary delays and limits data throughput through Huffman decompression engine 104 to one data block at a time.

Therefore, it would be desirable to have systems and methods that improve throughput and efficiency in the decompression of data blocks.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

Figure 1:
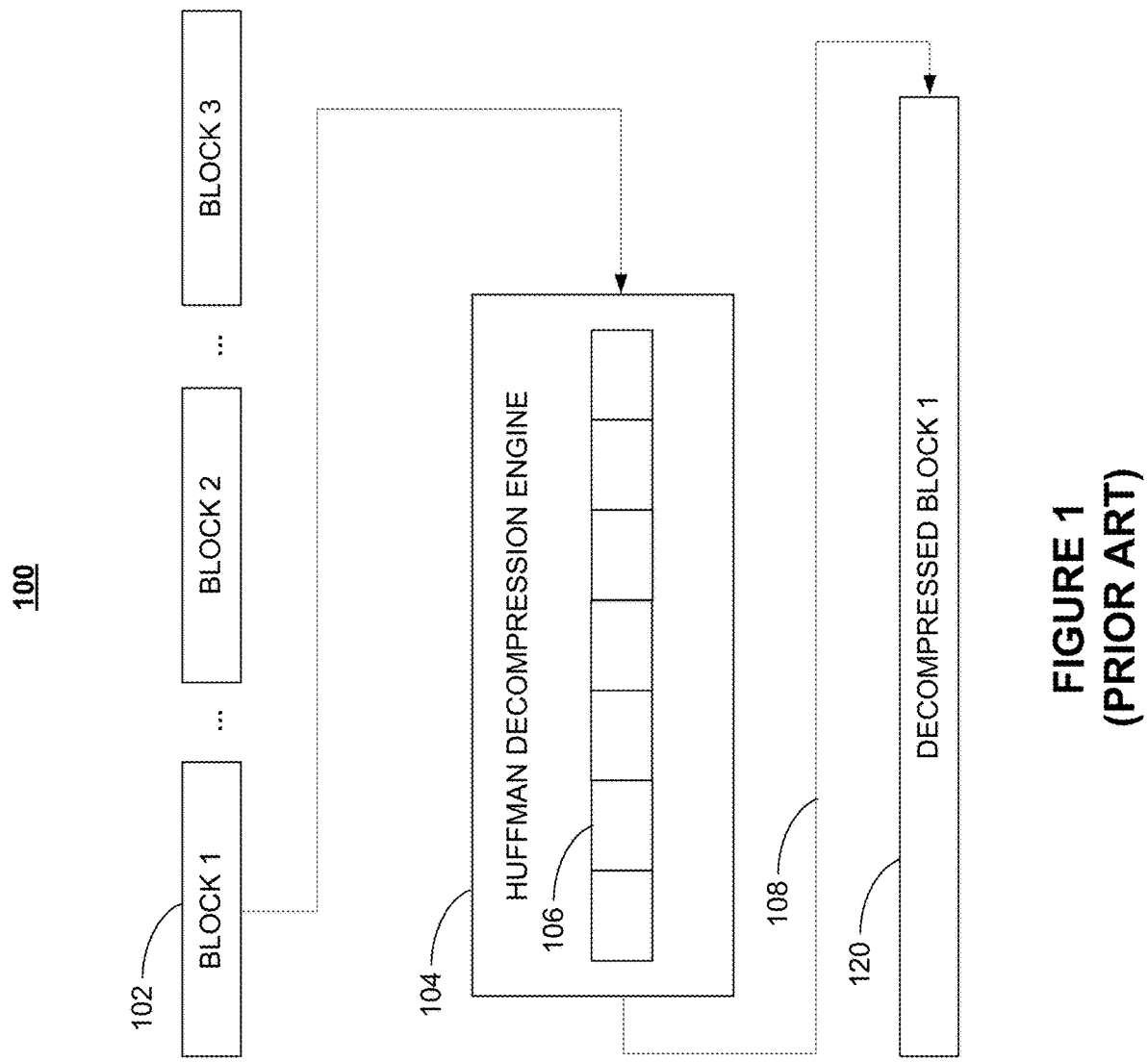
FIG. 1 illustrates a common sequential decompression scheme.
Figure 2:
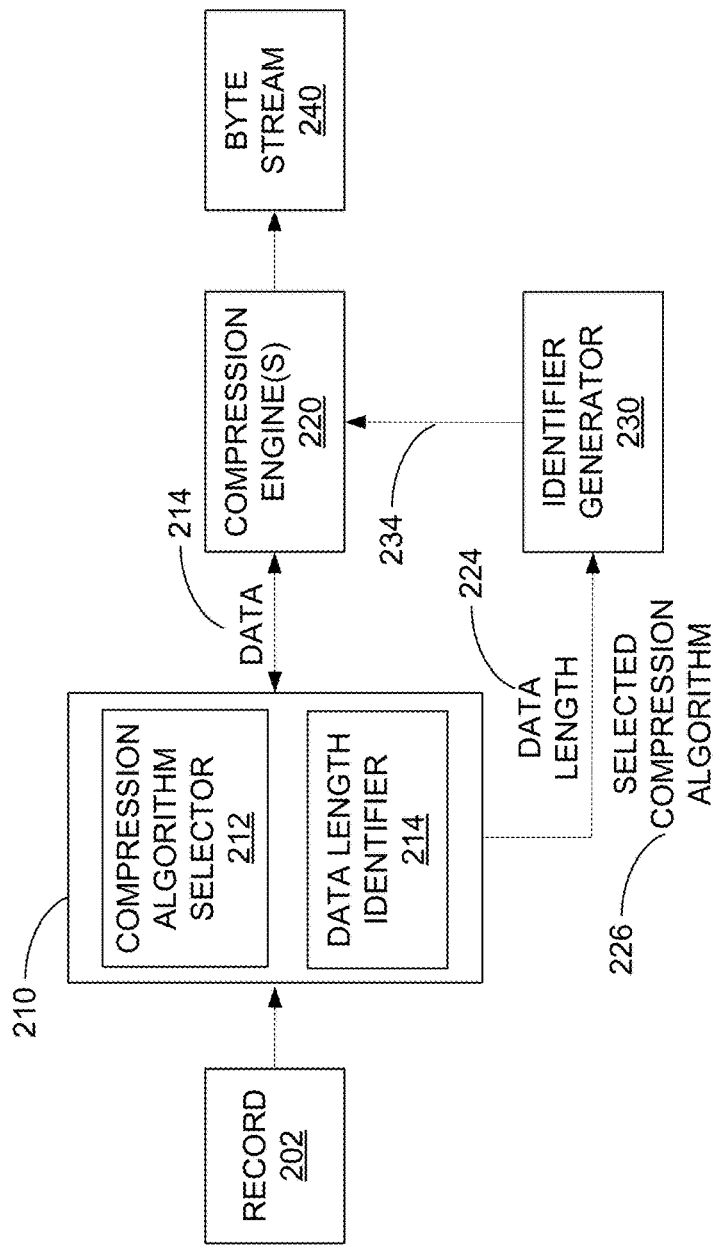
FIG. 2 illustrates a system for compressing records using an identifier, according to various embodiments of the present disclosure.

FIG. 2 illustrates a system for compressing records using an identifier according to various embodiments of the present disclosure. In embodiments, system 200 comprises pre-processor 210, compression engine 220, and identifier generator 230. As depicted in FIG. 2, pre-processor 210 further comprises compression algorithm selector 212 and data length identifier 214. In certain embodiments, the compression engine(s) 220 may be integrated within the pre-processor 210 such that data blocks are compressed at the time an appropriate compression algorithm is identified. In other embodiments, the compression engine(s) 220 is discrete circuitry and receives data blocks from the pre-processor 210 to be compressed in accordance with a selected compression algorithm.

In operation, pre-processor 210 receives record 202 and uses compression algorithm selector 212 to determine a suitable compression algorithm. The record 202 may be an image, a data file or any other type of data that is divided into data blocks for compression. In embodiments, compression algorithm selector 212 applies at least two different compression algorithms to data blocks from record 202 to identify a preferred compression algorithm for the particular data block. For example, a subset of data blocks from record 202 may be compressed using a first compression algorithm while another subset of data blocks is more suited to another compression algorithm. The compression algorithm selector 212 compares the results of the different compression algorithms in order to select one that produces a preferred compression algorithm. This selection may be based on the compression algorithm that has the shortest bit length, an algorithm that provides a meaningful improvement in decompression speed or other criteria known to one of skill in the art.

In embodiments, pre-processor 210 further uses data length identifier 214 to determine a compressed bit length for each data block from record 202 for a selected compression algorithm used on the particular data block. In embodiments, pre-processor 210 outputs data length 224 and selected compression algorithm 226 into identifier generator 230 that generates identifier 234 that is representative of at least one of data length 224 and selected compression algorithm 226. One skilled in the art will recognize that the identifier generator 230 may be integrated within the pre-processor 210 or be discrete circuitry within the system.

In embodiments, in response to receiving identifier 234, compression engine 220 compresses the data block 214 and appends identifier 234 to the compressed data block. In other embodiments, the compression engine 220 appends identifier 234 to the uncompressed data block and compresses both the data block 214 and the identifier 234. The compression engine 220 outputs the result as byte stream 240 of compressed data. One skilled in the art will recognize that the present invention may support any compression method including Full Block Huffman compression, Bit Mask with Huffman compression, Zero Block compression, Full Block compression with seven bit values, Bit Mask compression with seven bit values, Bit Mask with eight bit values and other compression methods. In certain instances, the analysis of compression algorithms may result in a decision not to compress a particular data block.

Figure 3A:
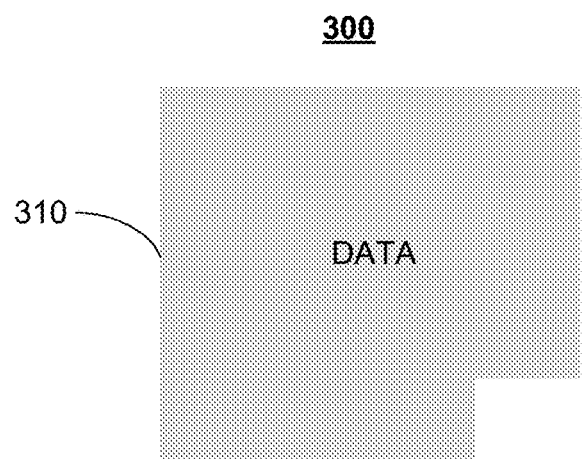
FIG. 3A shows input data in an arbitrary length buffer, according to various embodiments of the present disclosure.

FIG. 3A shows a record from which input data blocks for compression are arranged and stored in a buffer according to various embodiments of the present disclosure. In embodiments, the record 300 may be stored in any length of buffer and may comprise data 310, e.g., in X-bit value format. It is understood that data 310 may be pre-processed prior to being compressed by a compression algorithm. In addition, data 310 may be partitioned into data blocks using various techniques known in the art.

Figure 3B:
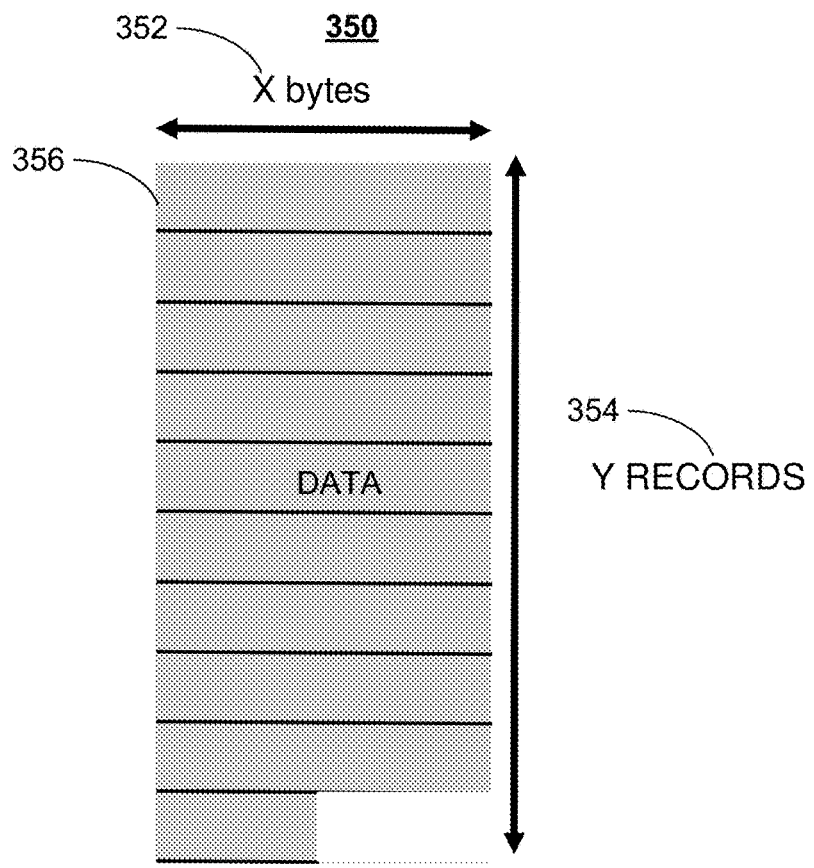
FIG. 3B illustrates the input data of FIG. 3A being arranged into records of a certain length.

FIG. 3B illustrates the input data of FIG. 3A being arranged into data blocks of a certain length. As depicted it FIG. 3B, input data 310 is arranged into a number Y data blocks 354 each having a length of a number X bytes 352 (e.g., 64 bytes). In embodiments, resulting data 350 is padded to inflate one or more data blocks 354 to the length of X bytes 352 to ensure uniform lengths for all data blocks 354.

Data blocks 354 may hold any type of information in any type of format (e.g., binary, symbols, etc.) that can be compressed. In embodiments, some or all of the data blocks 354 have the same bit length and are input to one or more compression engines (not shown in FIG. 3B) to select a compression method that may result in the relatively smallest compression size. Each compression engine may then compress some or all of the data blocks 354. It is further understood that some data blocks 354 may not undergo any compression at all.

Figure 4A:
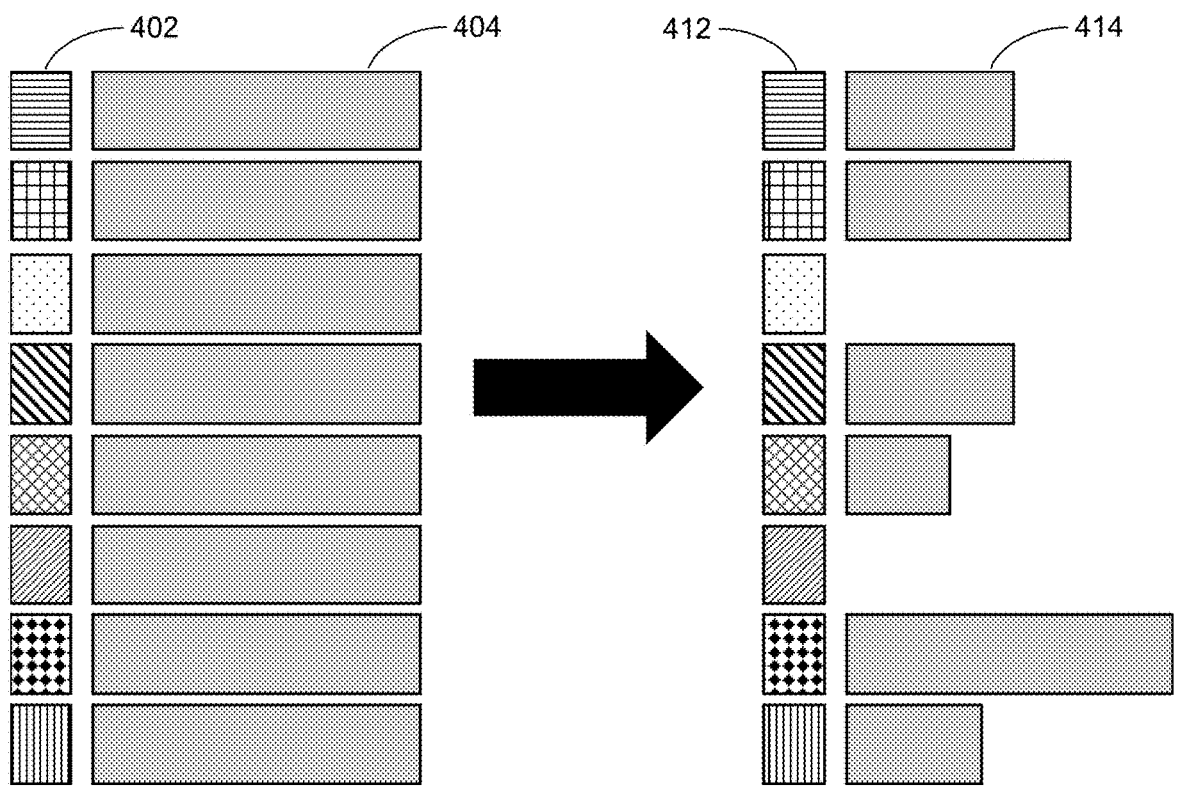
FIG. 4A illustrates compression of records based on compression type, according to various embodiments of the present disclosure.

As shown in FIG. 4A, the type of compression and the resulting data length are used to generate an identifier 402 that may, according to various embodiments of the present disclosure, be assigned and/or appended to data block 404. Identifier 402 may be, for example, one or more control bytes that comprises information about the method that has been used, if at all, to compress data block 404 and/or the length of the compressed data block 404, e.g., in a length field. In embodiments, identifier 402 allows a decompression engine to determine a suitable decompression algorithm to properly decompress data block 404.

In embodiments as previously discussed, identifier 402 may be compressed together with data block 404 to obtain compressed data block 414. However, this is not intended as a limitation on the scope of the present disclosure as identifier 402 may equally be appended to compressed data block 414. In other words, an algorithm may parse uncompressed data into fixed length chunks 404 and identify a preferred compression algorithm by cycling through a plurality of available compression algorithms and selecting the preferred compression algorithm based on the efficiency of each tested algorithm. A corresponding identifier 412 is generated and appended to compressed data 414.

In embodiments, the compression engine(s) compress each data block 404 in order to compress it to a smaller size block 414. It is understood that depending on the type of compression method that has been chosen and the content of data block 404, the bit lengths of resulting compressed blocks 414 may vary.

Figure 4B:
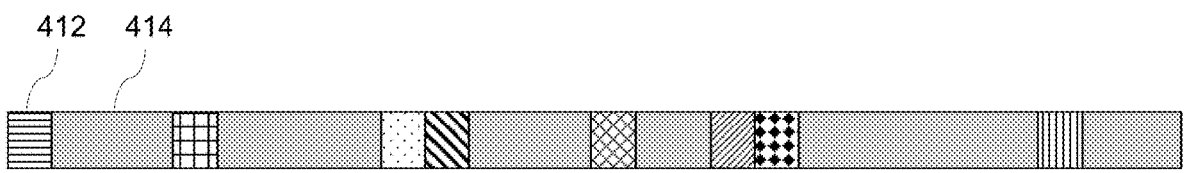
FIG. 4B illustrates an output stream of data bits comprising records and identifiers, according to various embodiments of the present disclosure.

FIG. 4B illustrates an output stream of data bits comprising compressed data blocks and identifiers according to various embodiments of the present disclosure. In embodiments, the encoded data blocks 414 may be output, together with identifiers 412, from the compression engine, e.g., by shifting data, e.g., as a stream of data bits 450, into a pipeline (not shown in FIG. 4B). In certain examples, a first subset of compressed data within the stream of compressed data bits 450 may have been compressed using a first compression algorithm and a second subset of compressed data within the stream of compressed data bits 450 may have been compressed using a second compression algorithm. These different compression algorithms are appropriately identified in one or more identifiers 412.

Figure 5:
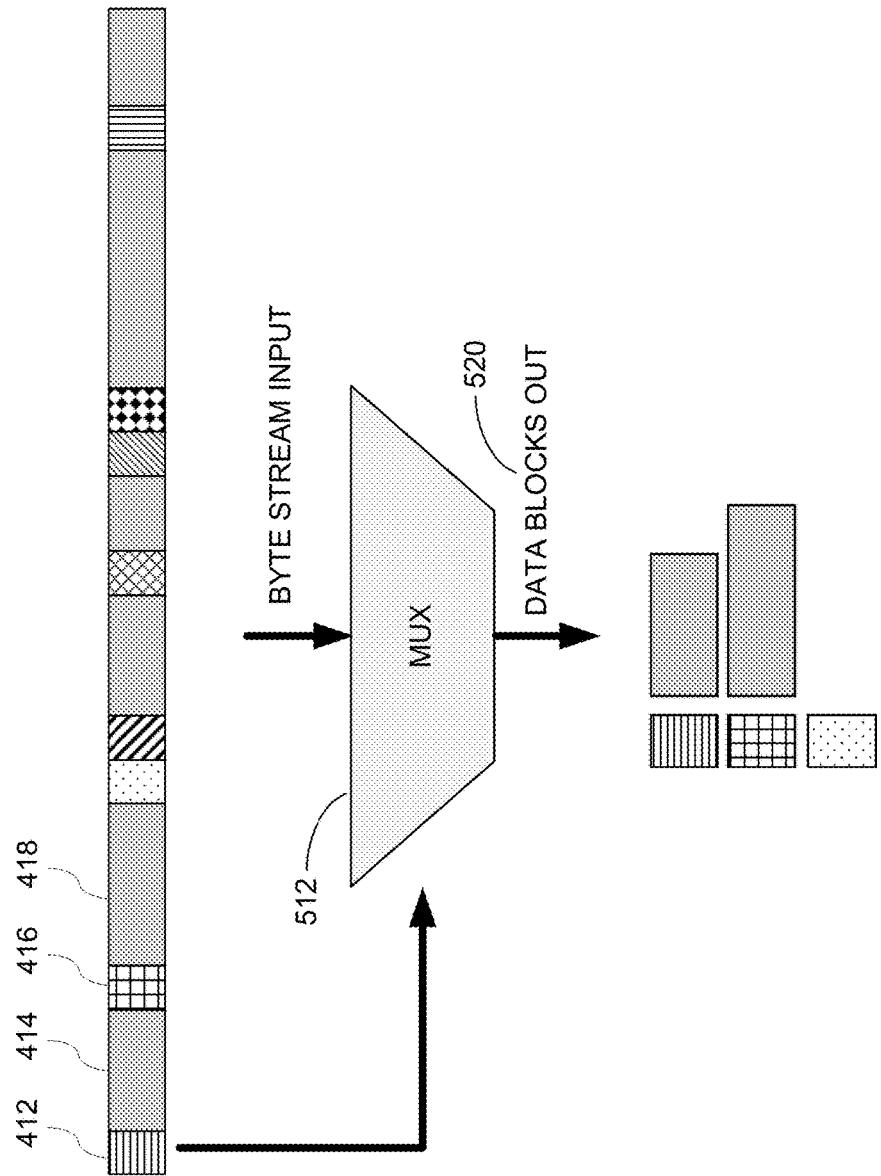
FIG. 5 illustrates parsing of a byte stream of compressed data into records prior to decompression, according to various embodiments of the present disclosure.

FIG. 5 illustrates parsing of a byte stream of compressed data blocks prior to decompression and associating each compressed data block with a compression algorithm according to various embodiments of the present disclosure. A decompression process for each data block may be assigned to a particular decompression engine based on the compression algorithm used to compress the particular data block. In addition, the compressed data blocks may be sequentially aligned with other data blocks as an input into a decompression engine using the block length contained within the identifier.

In FIG. 5, byte stream 450 may be parsed into data blocks 520 as follows: In embodiments, in an initial step, identifier 412 may undergo an initial decoding operation (if the identifier was previously compressed) intended to extract information contained therein, such as the length of compressed record 414. In embodiments, the length of compressed record 414 may be implied or encoded, e.g., in a length field. In embodiments, the length of compressed record 414 may be used to determine the relative position of compressed record 418 and/or its identifier 416 within byte stream 450. In other embodiments, if the identifier 412 was not compressed, then the compression algorithm and data length value may be immediately extracted.

In embodiments, the extracted information may be used by multiplexer 512 to parse the bits of byte stream 450 to determine how many bits multiplexer 512 has to move to access and process at the next record in byte stream 450.

In embodiments, each compressed record 414 and its identifier 412 may be processed by multiplexer 512 and output in their original order. However, the original, i.e., uncompressed lengths of records 520 may be unknown to multiplexer 512.

Figure 6:
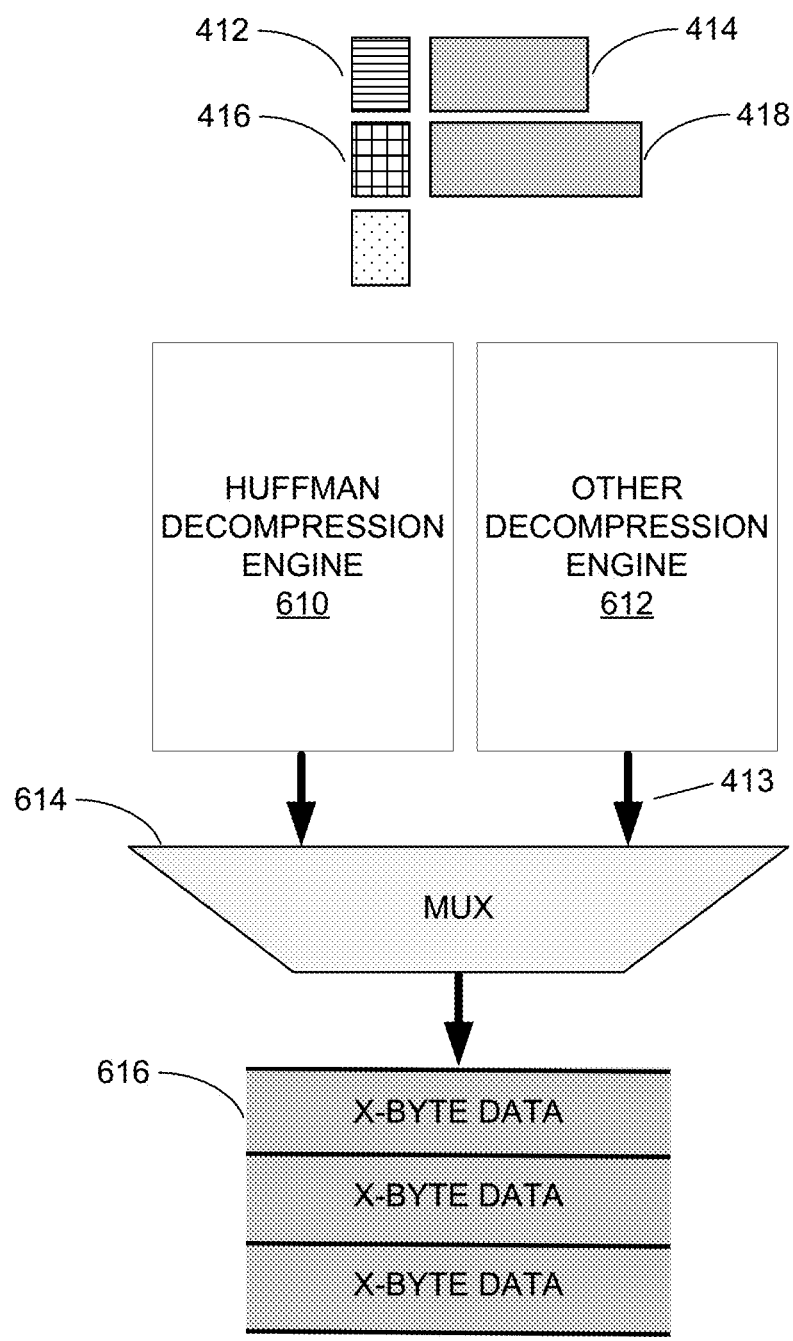
FIG. 6 illustrates decompression of records based on various compression types, according to various embodiments of the present disclosure.

FIG. 6 illustrates decompression of a variety of different data blocks compressed using various compression types according to various embodiments of the present disclosure. In embodiments, the compressed data blocks are decompressed using one or more decompression engines 610, 612.

In embodiments, a compression algorithm selector (shown in FIG. 2) may be used to select a certain compression algorithm, based on the compression type, utilization, etc., of each compressed data block, to which a corresponding decompression engine 610, 612 is associated to decompress the particular compressed data block. In embodiments, decompression operations are optimized by operating one or more decompression engine 610, 612 in parallel when processing data blocks. The use of the identifier 412 allows the routing of compressed data blocks within appropriate decompression paths within the system. The use of parallel, pipelined decompression engines results in an accelerated and efficient architecture to decompress a diverse set of compressed data blocks. It is understood that any number of decompression engines 610, 612 maybe used and monitored to optimize calculations and utilize decompression engines 610, 612 to full capacity.

In embodiments, based on information extracted from identifier 412, the bit length of record 414 is known. As a result, the location of the data block 418 may be identified and used to determine a number of bytes to shift to arrive at that location in order to commence parsing of data block 418 before the parsing of data block 414 has been completed, thereby, enabling pipelined and/or parallel operations. In addition, any number of records and/or identifiers 412-418 may be sent to any number of different decompression engines 610-612 to be parallelly processed. In other words, by knowing the distance from data block to data block, the decoding process for a subsequent data block can begin without having to wait for an entire decompression process for a data block to complete, ultimately, increasing throughput.

Decompression engines 610, 612 may be implemented in any number ways, for example, as hardware pipelines. A hardware pipeline may be a fixed pipeline having a known length (e.g., cycles deep). In embodiments, decompression engine 610, 612 may receive one compressed data block 414, 418 of a variable length and output one uncompressed data block of a certain size per cycle after processing record 414, 418 in a number of cycles during a decompression step. As depicted in example in FIG. 6, decompression engine 610 comprises one or more Huffman-type decompression engines, and decompression engine 612 that may comprise one or more decompression engine of any other type.

In embodiments, to increase decoding speed, compressed data block 414, 418 has a variable symbol length with a fixed number (e.g., 4) of LSB bits of a symbol, as illustrated by the following example:

```
always @ (*)
  casez(Bits[3:0])
    4'b???0: Length[4:0]=5'b00001;  // 5b 16 symbols ????.0
    4'b??01: Length[4:0]=5'b00010;  // 6b 16 symbols ????.01
    4'b?011: Length[4:0]=5'b00100;  // 8b 32 symbols ?.????.011
    4'b0111: Length[4:0]=5'b01000;  // 10b 64 symbols ??.????.0111
    4'b1111: Length[4:0]=5'b10000;  // 11b 128 symbols ??.????.?1111
  endcase
```

It is noted that this modified Huffman-type decompression method is different from a classical Huffman decompression that uses an algorithm to build a tree on the fly, which requires evaluating many bits, depending on the depth of the tree, to find the length of a current symbol. In contrast, in embodiments, a tree topology may be pre-defined, then values may be mapped to the resulting fixed tree topology for optimal compression. This facilities finding a next symbol quickly to repeat the process for all (e.g., 64) values in a compressed block, thereby, increasing throughput.

In embodiments, decompressed data blocks 613 may be first entered into multiplexer 614 that assembles the blocks generated by each engine 610, 612 into decompressed data blocks 613 that may be restored, i.e., inflated, to their pre-compression size (e.g., 64 bytes). If, for example, identifier 412 is a single byte that indicates that the content of associated compressed record 414 is all zeros, then decompression engine 610, 612 will inflate data block 414 to have 64 zeros. Records 616 may then be output and stored, e.g., in an SRAM device.

Figure 7:
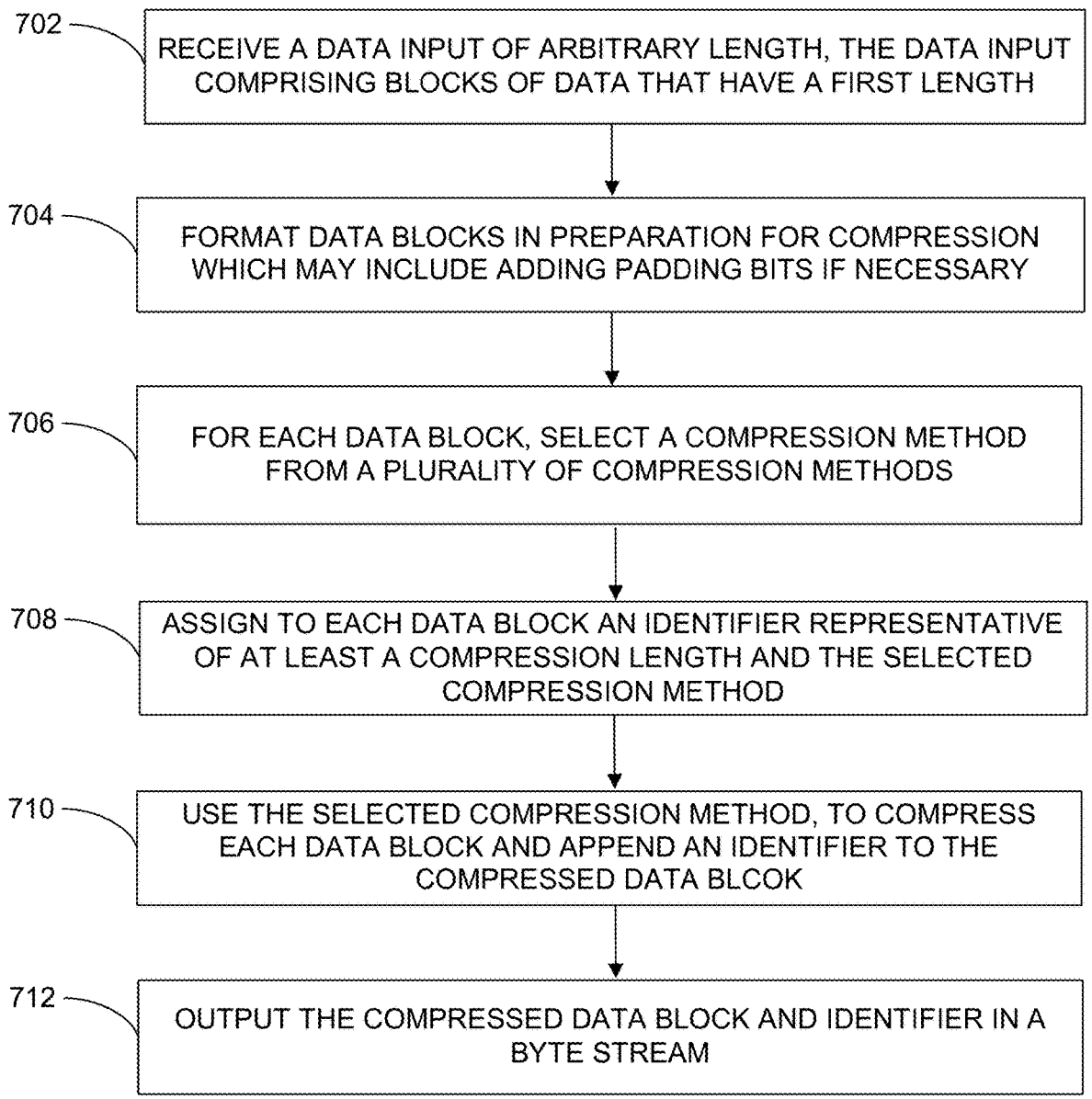
FIG. 7 illustrates a selective compression and identification method for records to reduce decompression time, according to various embodiments of the present disclosure.

FIG. 7 illustrates a selective compression and identification method for data blocks to reduce decompression time according to various embodiments of the present disclosure. Process 700 begins at step 702 when a data input of arbitrary length is received. In embodiments, the data input comprises blocks of data that have a first length.

At step 704, the blocks of data are formatted in preparation for compression. This formatting may include padding one or more of the blocks.

At step 706, for each data block, a compression method may be selected from a plurality of compression methods.

At step 708, an identifier may be assigned to each data block. The identifier is representative of at least a compression length and the selected compression method. The identifier is used to select a decompression path for the data block and support efficient serial alignment of the compressed data block into the decompression engine.

At step 710, the selected compression method is used to compress each data block. In one embodiment, the data block is compressed and the identifier is appended to the compressed data block (i.e., the identifier is not compressed). In another embodiment, the identifier is appended to the data block before compression and both the data block and its identifier are compressed.

At step 712, the compressed data blocks with identifiers are output, for example in a byte stream.

Figure 8:
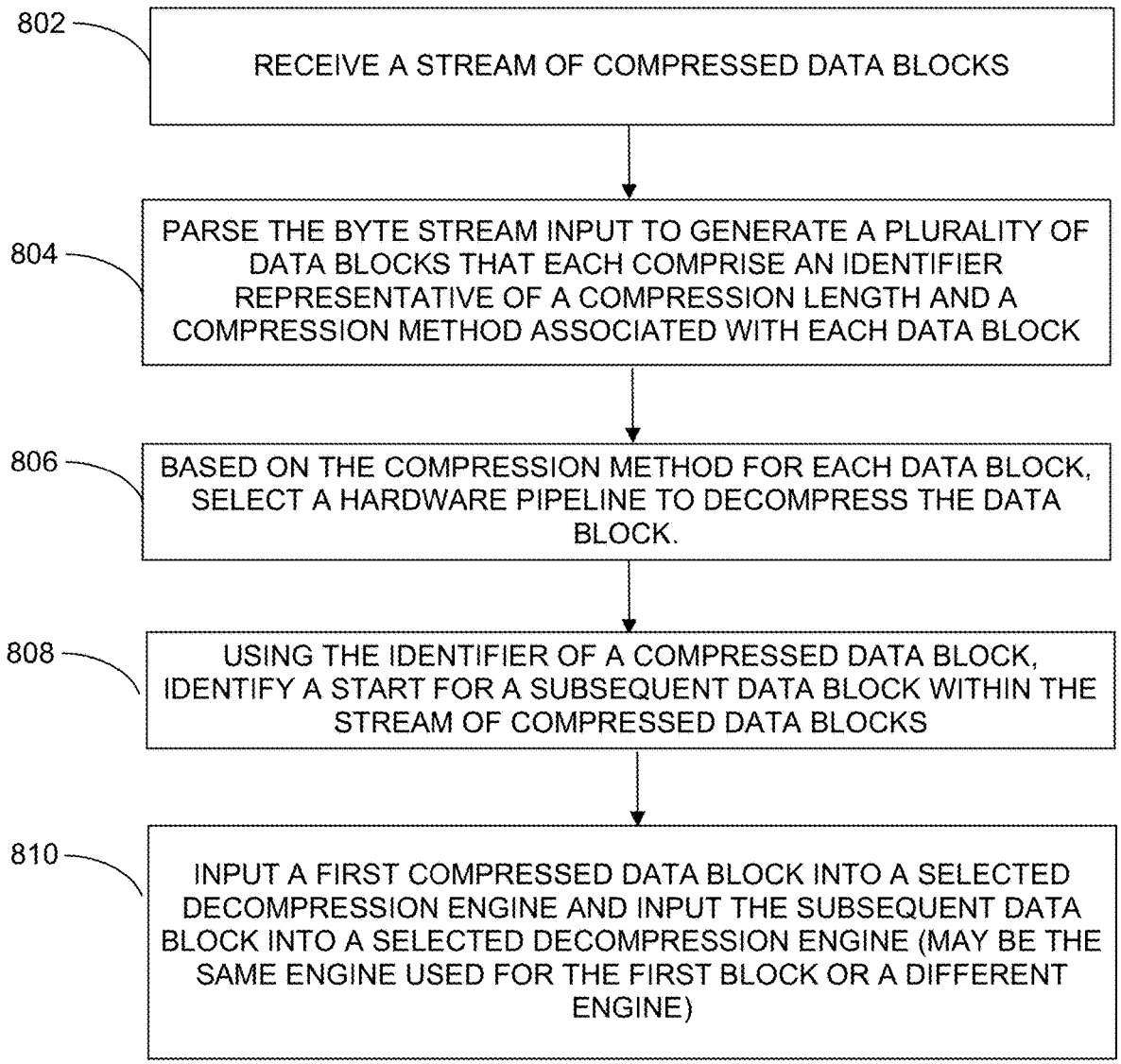
FIG. 8 illustrates a decompression method for records having identifiers, according to various embodiments of the present disclosure.

FIG. 8 illustrates a decompression method for records having identifiers according to various embodiments of the present disclosure. Process 800 begins at step 802 when a stream of compressed data blocks and corresponding identifiers is received as an input.

At step 804, the stream of compressed data blocks is parsed to generate a plurality of compressed data blocks that each comprise an identifier that is representative of a compression length and a compression method associated with each data block.

At step 806, based on the compression method that was used for each data block, a hardware pipeline is selected to decompress the decompress the data block. Using the length of the compressed data block found within the identifier, the system can identify 808 a start of a second compressed data block and schedule it for decompression.

Finally, at step 810, the data blocks may be input into one or more hardware pipelines/decompression engines in order to decompress the data blocks to a pre-compression length. The decompression of the data blocks may occur in parallel across multiple decompression engines or may occur serially in a single decompression engine or a combination thereof.

It shall be noted that: (1) certain steps may optionally be performed; (2) steps may not be limited to the specific order set forth herein; (3) certain steps may be performed in different orders; and (4) certain steps may be done concurrently.

What is claimed is:

1. A compression system for compressing a plurality of data blocks, the compression system comprising:
   a pre-processor coupled to receive a plurality of data blocks;
   a compression selector coupled within the pre-processor, the compression selector configured to select a first compression method for a first data block within the plurality of data blocks and a different second compression method for an adjacent second data block within the plurality of data blocks;
   a data length identifier coupled within the pre-processor that identifies a first compressed block length associated with a compressed first data block using the first compression method and a second compressed block length associated with a compressed second data block using the second compression method;
   an identifier generator that generates a first identifier for identifying a preferred first compression method for the first compression method and the first compressed block length and a different second identifier for identifying a preferred second compression method for the second compression method and second compressed block length; and
   a compression engine coupled to receive the first data block and first identifier, the compression engine compresses the first data block in accordance with the preferred first compression method and appends the first identifier to the first compressed data block and receive the adjacent second data block and second identifier, the compression engine compresses the second data block in accordance with the preferred second compression method and appends the second identifier to the second compressed data block.

2. The compression system of claim 1 wherein the pre-processor, identifier generator and compression engine is integrated on a single substrate.

3. The compression system of claim 1 wherein the pre-processor and compression engine are discrete circuitry.

4. The compression system of claim 1 wherein first identifier is subsequently processed to identify the preferred first compression method and the first compressed block length by a decompression system.

5. The compression system of claim 1 wherein the compression engine outputs a stream of compressed data blocks and associated identifiers.

6. The compression system of claim 1 wherein the identifier generator identifies a preferred compression method for at least one of the first compression method or the second compression method based on an efficiency test.

7. The compression system of claim 1 wherein the compression engine outputs the compressed first data block and the appended first identifier, and the compressed second data block and the appended second identifier into an output stream of compressed data blocks.

8. The compression system of claim 7 wherein the output stream is formed by the compression engine by shifting at least one of the compressed data blocks.

9. The compression system of claim 8 wherein the output stream formed by the compression engine is output into a pipeline.

10. The compression system of claim 1 wherein at least one preferred compression method is selected from the group consisting of: zero block encoding, full block encoding, bit mask encoding, full block Huffman encoding and bit mask with Huffman encoding.

11. A compression method to compress a plurality of data blocks, the method comprising:
   receiving input data;
   arranging the input data into a plurality of data blocks;
   selecting a first compression method for a first data block within the plurality of data blocks and a different second compression method for an adjacent second data block within the plurality of data blocks;

identifying a first compression block length associated with a compressed first data block using the first compression method and a second compression block length associated with a compressed second data block using the second compression method;

generating a first identifier for identifying a preferred first compression method for the first compression method and the first compressed block length and a different second identifier for identifying a preferred second compression method for the second compression method and second compressed block length;

compressing the first data block in accordance with the preferred first compression method and the second data block in accordance with the preferred second compression method;

appending the first identifier to the first compressed data block, the first identifier comprising information related to the preferred first compression method and the first compression block length of the first data block, and the second identifier to the second compressed data block, the second identifier comprising information related to the preferred second compression method and the second compression block length of the second data block; and outputting the compressed first data block and the appended first identifier, and the compressed second data block and the appended second identifier within a stream of compressed data blocks.

12. The compression method of claim 11 wherein at least one preferred compression method is selected from the group consisting of: zero block encoding, full block encoding, bit mask encoding, full block Huffman encoding, and bit mask with Huffman encoding.

13. The compression method of claim 11 wherein the preferred first compression method is identified based at least on a resulting size of the compressed first data block such that the preferred first compression method generates a smaller block length than other compression methods within a plurality of available compression methods.

14. The compression method of claim 11 wherein the input data is arranged into a plurality of data blocks having a fixed length.

15. The compression method of claim 14 wherein at least one data block within the plurality of data blocks is padded such that the at least one data block has a length corresponding to the fixed length.

16. The compression method of claim 11 wherein the first identifier is appended to the compressed first data block in an uncompressed format.

17. The compression method of claim 11 wherein the first identifier is appended to the compressed first data block in a compressed format.

18. The compression method of claim 11 wherein the preferred second compression method is identified based at least on a resulting size of the compressed second data block such that the preferred second compression method generates a smaller data length than other compression methods within a plurality of available compression methods.

19. The compression method of claim 11 wherein the second identifier is appended to the compressed second data block in an uncompressed format.

20. The compression method of claim 11 wherein the second identifier is appended to the compressed second data block in a compressed format.

* * * * *